United States Patent [19]
Ortiz

[11] Patent Number: 5,842,261
[45] Date of Patent: *Dec. 1, 1998

[54] SEMICONDUCTOR PACKAGE EXTRACTOR AND METHOD

[75] Inventor: Daniel C. Ortiz, Austin, Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 749,870

[22] Filed: Nov. 15, 1996

[51] Int. Cl.⁶ .............................. B23P 19/04; H05K 13/00
[52] U.S. Cl. ............................ 29/426.5; 29/260; 29/261; 29/266; 29/741; 29/758; 29/764
[58] Field of Search ............................ 29/740, 741, 758, 29/762, 764, 426.5, 253, 260, 261, 266

[56] References Cited

U.S. PATENT DOCUMENTS

| | | | |
|---|---|---|---|
| 3,401,445 | 9/1968 | Fritch | 29/261 |
| 4,180,903 | 1/1980 | Hannigan, Jr. | 29/261 X |
| 4,521,959 | 6/1985 | Sprenkle | 29/764 X |
| 4,583,288 | 4/1986 | Young | 29/261 |
| 4,800,647 | 1/1989 | Guyer | 29/764 X |
| 4,984,355 | 1/1991 | Lubrano et al. | 29/764 X |
| 5,193,269 | 3/1993 | Dattilo | 29/764 |
| 5,230,143 | 7/1993 | Karlovich | 29/758 X |
| 5,365,653 | 11/1994 | Padrun | 29/741 |
| 5,502,887 | 4/1996 | Gonzales | 29/758 X |

FOREIGN PATENT DOCUMENTS

| | | | |
|---|---|---|---|
| 2745966 | 4/1979 | Germany | 29/764 |
| 2813481 | 7/1979 | Germany | 29/764 |
| 1511104 | 9/1989 | U.S.S.R. | 29/260 |

OTHER PUBLICATIONS

IBM Technical Disclosure Bulletin vol. 28, No. 9, Feb. 1986, pp. 3823–3824.

*Primary Examiner*—Peter Vo
*Attorney, Agent, or Firm*—Rita M. Wisor

[57] ABSTRACT

A semiconductor package extractor is provided that extracts a semiconductor package from a socket on a circuit board. The extractor has an outer base and an inner base which are attached via a bolt. Turning the bolt raises or lowers the inner base. The inner base has an inner frame with multiple levers that swing freely inward and outward attached to the inner frame. The levers swing outward to surround the semiconductor package as the inner base is lowered onto the inner base and underlying circuit board. The levers swing inward to securely grip the semiconductor package as the outer base is lowered onto the circuit board. As the bolt is turned, the inner base, gripping the semiconductor package, is raised, removing the semiconductor package from the circuit board.

8 Claims, 6 Drawing Sheets

SEMICONDUCTOR PACKAGE EXTRACTOR AND METHOD

BACKGROUND OF THE INVENTION

1. Field of the Invention

This invention relates to devices and tools used to remove semiconductor packages from semiconductor package holders.

2. Background

Semiconductor chip packaging varies from surface mount packages to through hole packages. A typical through hole part is the ceramic pin grid array (PGA). A PGA is typically a square package with an array of pins or leads on the underside of the part for making signal connections to the circuit board. The semiconductor chip may be attached to a circuit board by inserting the pins through holes on the circuit board and soldering the pins directly to the board. Another method of connection is by inserting the semiconductor chip into a socket which has been soldered to the circuit board.

Using a socket is the preferable method of connection for semiconductor packages that will periodically be replaced. For example, upgradable boards or boards that are used in test labs to test parts need to periodically replace semiconductor packages.

Typical methods to extract semiconductor packages from a socket include attempting to remove the chip manually, sometimes using available objects such as a screw driver or other sharp objects to pry the package out of the socket. These methods often cause damage to the circuit board or the semiconductor package. Removing a semiconductor package from a socket requires a great deal of force, and care must be taken not to damage the board, the chips or the socket. Damage includes scratches to the board, damage to surrounding parts, bent pins on the semiconductor package, and chipped edges and corners of the package, any of which may destroy or render useless the parts damaged.

A simple, inexpensive method of extracting semiconductor packages from their holders is needed. This method should not damage boards or chips, should be easy to use, quick, and not require a great deal of force.

SUMMARY OF THE INVENTION

A new tool for extracting a semiconductor package from a semiconductor package holder is disclosed. This device is easy to use and should not damage boards or semiconductor packages when used properly. The invention is a device which allows the user to easily grasp and pull the semiconductor package in a desirable direction, typically perpendicular to the underlying circuit board, thereby minimizing the possibility of damaging the semiconductor package or the underlying circuit board.

In the preferred embodiment, the invention is a device with an outer base and with an inner base attached to the outer base via a bolt. The preferred inner base includes an inner frame and four levers movably attached to the inner frame via pins. The four levers swing both inward and outward. As the assembled device is lowered onto the circuit board, the levers of the inner base make contact with the semiconductor package and the underlying circuit board prior to the outer base making contact with the circuit board. The levers swing outward to surround the semiconductor chip as the inner base is lowered onto the socket and board. As the outer base is lowered onto the inner base and underlying circuit board, the levers of the inner base swing inward securely around the semiconductor chip due to the sides of the outer base pushing the levers inward thereby securely gripping the semiconductor chip. Once the outer base rests squarely on the circuit board, the inner base and the captured semiconductor chip is contained therein. Turning the bolt raises or lowers the inner base within the outer base. As the inner base is raised by turning the bolt, the levers lift the captured semiconductor chip. The outer base acts as a platform to evenly distribute the force of removing the semiconductor chip from the socket on the circuit board.

A further understanding of the nature and advantages of the present invention may be realized by reference to the remaining portions of the specification and the drawings.

BRIEF DESCRIPTION OF THE DRAWINGS

So that the manner in which the above recited advantages and features of the present invention, as well as others which will become apparent, are attained and can be understood in detail, a more particular description of the invention summarized above may be had by reference to the embodiment thereof which is illustrated in the appended drawings, which drawings form a part of this specification. It is to be noted, however, that the appended drawings illustrate only typical embodiments of the invention and are therefore not to be considered limiting of its scope, for the invention may admit to other equally effective embodiments.

DETAILED DESCRIPTION OF PREFERRED EMBODIMENTS

Figure 1:
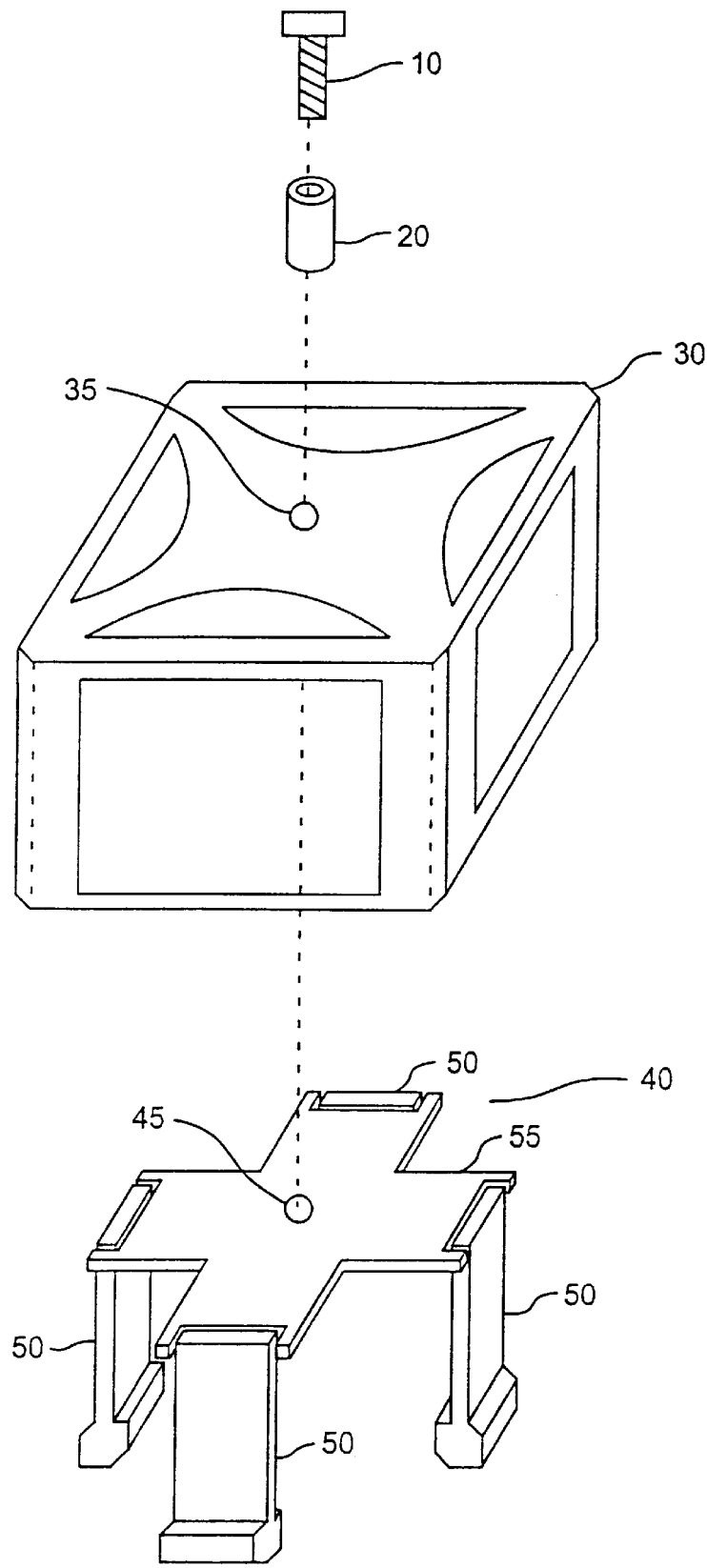
FIG. 1 is a diagram showing an assembly of a preferred embodiment of a semiconductor package extractor.

FIG. 1 is a diagram showing the assembly of a preferred embodiment of a semiconductor package extractor. A bolt 10 is inserted into a spacer 20. The spacer 20 is preferably not threaded, larger in diameter than the threads of bolt 10, and not larger in diameter than the head of bolt 10. The bolt/spacer combination is then inserted into an outer base 30 via a bolt aperture 35 in the outer base 30, the bolt aperture 35 being preferably not threaded and larger in diameter than the threads of bolt 10, but not larger in diameter than spacer 20. The bolt/spacer/outer base combination is then inserted over an inner base 40 and attached via the bolt 10 and a bolt aperture 45 in the inner base 40, the bolt aperture 45 being preferably threaded. The preferred inner base 40 has an inner frame 55 with four levers 50 that swing freely inward and outward. By turning the bolt 10, which couples the outer base 30 to the inner base 40, the inner base 40 is raised or lowered with respect to the outer base 30. Since the outer base bolt aperture 35 and spacer 20 are not threaded, the outer base 30 and spacer 20 move freely on the bolt 10 between the head of the bolt 10 and the inner base 40. In this way, as the entire apparatus is lowered the outer base 30 can be lowered freely after the inner base 40 has made contact with the semiconductor chip, socket and circuit board.

Turning the bolt 10 may be achieved in many ways. For example, the bolt 10 may be turned manually or with the use of a ratchet device. A preferred method is attaching a plastic T-Cap to the head of the bolt 10, thereby creating an easier grip for turning the bolt 10 by hand.

Figure 2:
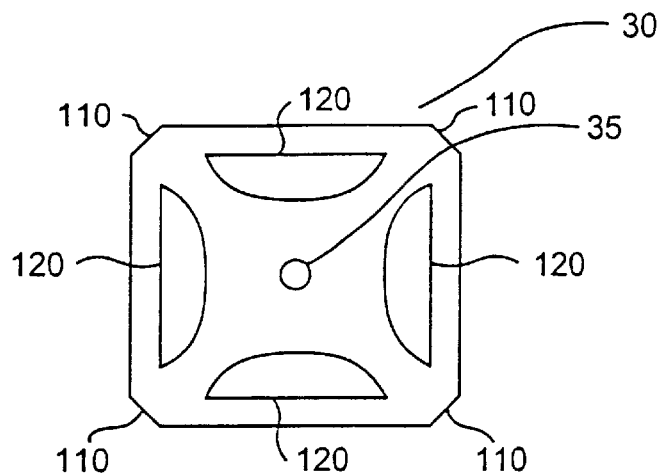
FIG. 2 is a diagram showing a top view of a preferred outer base.

FIG. 2 is a diagram showing a top view of a preferred outer base 30. Corners 110 are trimmed to reduce the foot print of the outer base 30, thereby avoiding other parts and chips on the circuit board. Cutouts 120 provide for lighter weight construction thereby making the extractor easier to handle and cheaper to manufacture. The shape of corners 110 and cutouts 120 is not critical to device operation so long as the structural integrity of the extractor is maintained and sufficient surface area is maintained for spreading the force of extracting a semiconductor chip. The bolt aperture 35 is not threaded and is larger in diameter than the threads of bolt 10 but smaller in diameter than the spacer 20, thereby allowing the bolt 10 to be loosely inserted into the spacer 20 and the bolt aperture 35, keeping the head of the bolt 10 separate from the outer base 30 by spacer 20.

Figure 3:
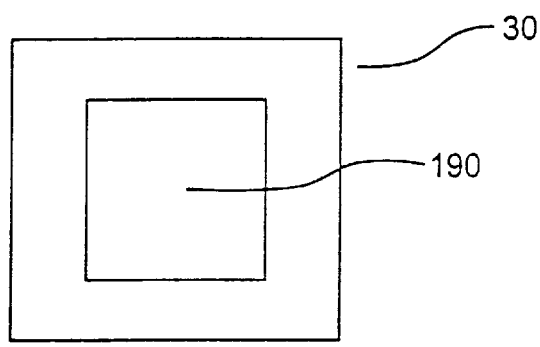
FIG. 3 is a diagram showing a side view of the preferred outer base.

FIG. 3 is a diagram showing a side view of the preferred outer base 30. Preferably, the outer base 30 has four sides to enable the secure surrounding and gripping of the semiconductor chip. Cutout 190 provides for lighter weight construction. The shape of cutout 190 is not critical to device operation. In another embodiment, the cutout 190 of FIG. 3 may be enlarged vertically until it merges with one of the cutouts 120 of FIG. 2, forming one large cutout per outer base side.

Figure 4:
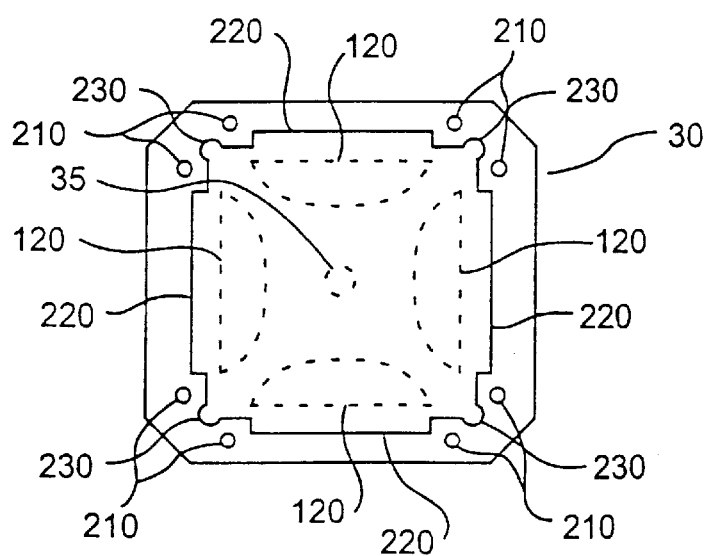
FIG. 4 is a diagram showing a bottom view of the preferred outer base.

FIG. 4 is a diagram showing a bottom view of the outer base 30. The lower side of outer base 30 is hollow, allowing insertion of the inner base 40. Rubber foot pads 210 are spaced evenly on the corners of the bottom of the outer base 30 to protect the surface of the circuit board during the removal of the semiconductor package from a socket or semiconductor package holder. Inner sides 220 allow room for the inner base levers 50 to fit snugly inside the outer base 30 so that levers 50 do not swing outward when gripping a semiconductor package but allow the inner base 40 to be raised and lowered without resistance. Corners 230 allow space for the semiconductor package corners, allowing the chip to be lifted easily without scraping the sides of the outer base 30. Since the lower side of outer base 30 is hollow, cutouts 120 and bolt aperture 35 from the top view of the outer base 30 can be seen from the bottom. The outer base 30 acts as a platform to evenly distribute the force of removing the semiconductor package from the holder.

Figure 5:
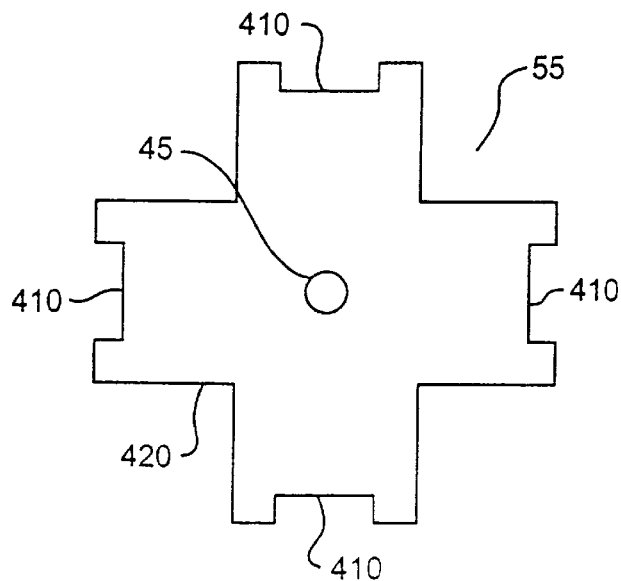
FIG. 5 is a diagram showing a top view of a preferred inner frame without levers attached.

FIG. 5 is a diagram showing a top view of a preferred inner frame 55 without the levers 50 attached. Four rectangular indentations 410 allow space for the attachment of the four levers 50. Cutouts 420 provide for lighter weight construction. The shape of cutouts 420 is not critical to device operation. The aperture 45 is threaded, and allows the bolt 10 to be threaded onto the inner frame 55.

Figure 6:
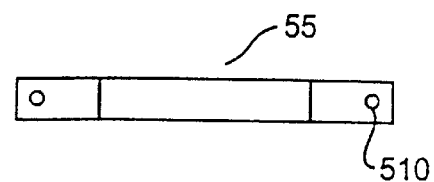
FIG. 6 is a diagram showing a side view of the preferred inner frame without levers attached.

FIG. 6 is diagram showing a side view of the preferred inner frame 55 without the levers 50 attached. Apertures 510 are drilled for the attachment of the levers 50 with pins which allow the levers 50 to swing freely.

Figure 7:
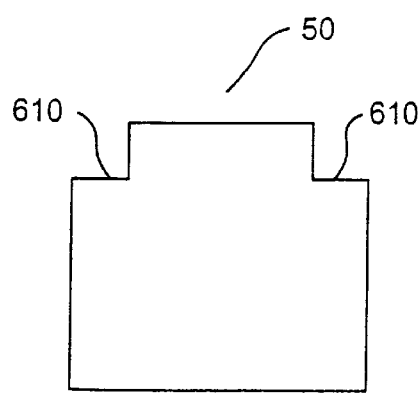
FIG. 7 is a diagram showing a first side view of a preferred lever.

FIG. 7 is a diagram showing a first side view of a preferred lever 50. Corner indentations 610 allow for the attachment of the lever 50 to the rectangular indentation 410 of the inner frame 55. Enough space is allowed for the lever 50 to swing freely.

Figure 8:
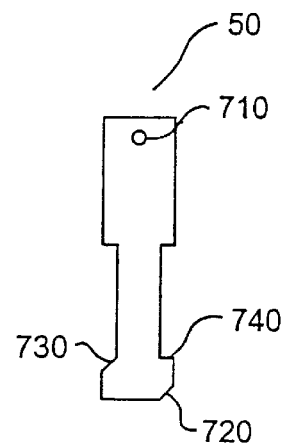
FIG. 8 is a diagram showing a second side view of the preferred lever.

FIG. 8 is a diagram showing a second side view of the preferred lever 50. Aperture 710 is for the insertion of a pin to attach the lever 50 to the inner frame 55. Cut angle 720 on the bottom interior edge of lever 50 is preferably a 45 degree angle to cause the outward swinging motion of the lever 50 as the inner base 40 is lowered onto the semiconductor chip in a socket on the circuit board. As the inner base 40 is lowered, cut angle 720 makes contact with the semiconductor chip edges and causes the lever 50 to swing outward, surrounding the chip. Cut angle 730 on the exterior edge of lever 50 is preferably a 45 degree angle to cause the inward swinging motion of the lever 50 as the outer base 30 is lowered onto the circuit board. Since the outer base bolt aperture 35 is not threaded, the outer base 30 can be lowered freely after the inner base 40 has made contact with the semiconductor chip, socket and circuit board. As the outer base 30 is lowered, cut angle 730 makes contact with the inner sides 220 of the outer base 30, causing the lever 50 to swing inward, securely surrounding the semiconductor chip. Cut angle 740 on the interior edge of lever 50 as shown is preferably a 90 degree angle to enable the secure lifting of the semiconductor chip as the inner base 40 is raised by turning the bolt 10.

Figure 9:
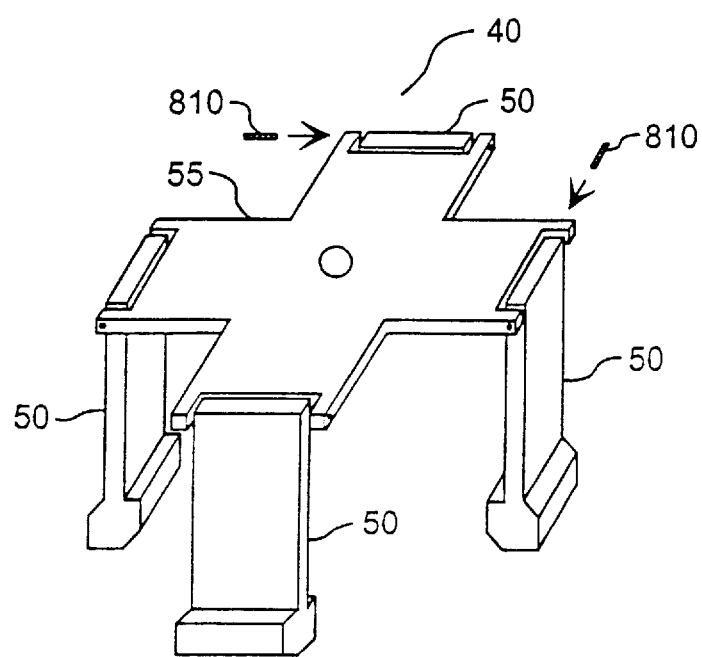
FIG. 9 is a diagram showing the assembly of a preferred inner base made up of the preferred levers attached to the preferred inner frame.

FIG. 9 is a diagram showing the assembly of a preferred inner base made up of the preferred levers 50 attached to the preferred inner frame 55. Pins 810 are inserted through apertures 510 of the inner frame 55 and apertures 710 of the levers 50 so that levers 50 are secured to the inner frame 55 and allowed to swing freely both inward and outward. To those of ordinary skill in the art, it is obvious that the inner base may be constructed with as few as two levers, such that the semiconductor chip is firmly gripped for vertical removal from the socket.

Figure 10A:
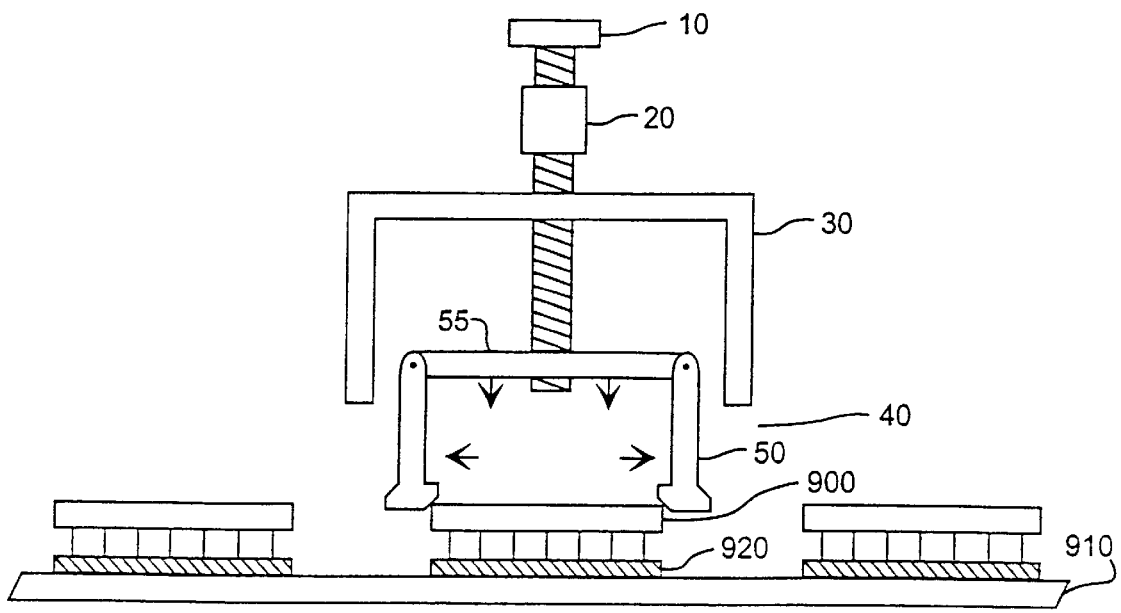
FIGS. 10A through 10D are diagrams showing first through fourth stages of the operation of the semiconductor package extractor according to the preferred embodiment of the invention.

FIG. 10A is a diagram showing the first stage of the operation of the semiconductor package extractor according to the preferred embodiment of the invention. A cut away portion of the outer base 30 is shown and inner base 40 is shown with only two levers 50 to facilitate the understanding of the operation of the semiconductor package extractor. The extractor is lowered onto the semiconductor package 900 which is seated in socket 920 on circuit board 910. The outer base 30 is not threaded and moves freely on bolt 10. The outer base 30 may be held so the inner base 40 contacts the semiconductor package 900 first. As the inner base 40 is lowered onto the semiconductor package 900, the levers 50 contact the edges of the package 900 first. The 45 degree cut angle on the interior edge of the levers 50 aid in guiding the levers 50 to swing outward, surrounding the semiconductor package 900.

Figure 10B:
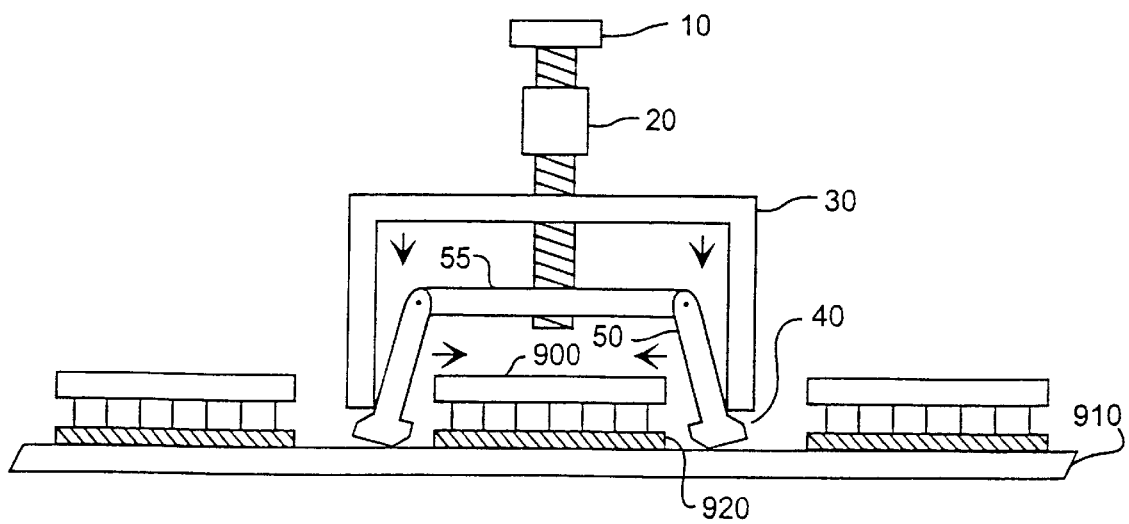

Figure 10B is a diagram showing the second stage of the operation of the semiconductor package extractor according to the preferred embodiment of the invention. The inner base 40 has been lowered onto the semiconductor package 900. The outer base 30 is now lowered onto the inner base 40. The lower edges of the outer base 30 contact the 45 degree cut angle on exterior edge of the levers 50, guiding the levers 50 to swing inward, securely gripping the package 900. The secure grip is enabled by the 90 degree cut angle on the interior edge on the ends of the levers 50 under the edges of the semiconductor package 900.

Figure 10C:
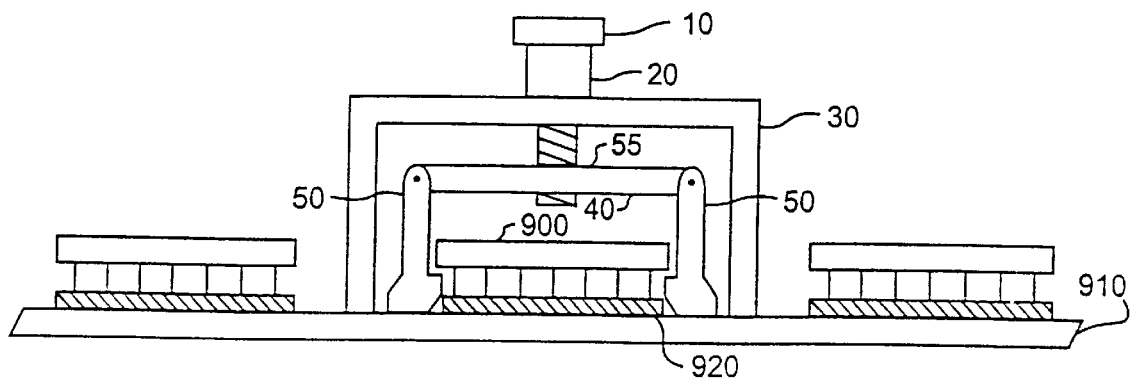

Figure 10C is a diagram showing the third stage of the operation of the semiconductor package extractor according to the preferred embodiment of the invention. As shown, the outer base 30 rests firmly on the circuit board 910, surrounding the inner base 40. The levers 50 of the inner base 40 securely grip the semiconductor package 900. This is facilitated by the 90 degree cut angle on the interior edges of the levers 50 being pushed under the edges of the semiconductor package 900.

Figure 10D:
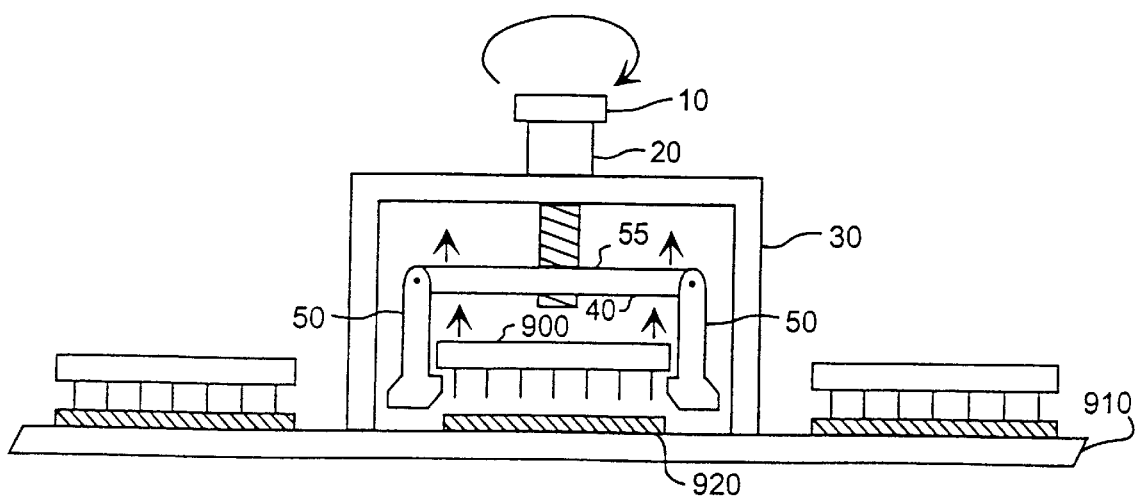

Figure 10D is a diagram showing the fourth stage of the operation of the semiconductor package extractor according to the preferred embodiment of the invention. As the bolt 10 is turned, the inner base 40 is lifted upward, lifting the semiconductor package 900 out of the socket 920. The outer base 30 remains resting on the circuit board 910, evenly distributing the forces exerted to lift the semiconductor package 900 out of the socket 920.

In the preferred embodiment, the construction of the inner base and the outer base is of a metal alloy. To those of ordinary skill in the art, it is obvious that the construction of the inner base and the outer base may be of any metal, plastic or other material hard enough to withstand the forces of gripping and lifting the semiconductor package out of the socket.

In an alternate embodiment, the inner base can be used alone. The inner base is lowered onto the semiconductor package in a socket, surrounding the package. The levers are held in place manually and the inner base is raised by hand, lifting the package out of the socket. In a similar embodiment, instead of holding the levers in place by hand, the levers may be strapped together, firmly gripping the package.

Several alternative methods may also be used for raising the inner base, including the previously mentioned raising via a bolt and by hand. These methods raise the inner base vertically so as to not bend any pins on the semiconductor package. A simple push-pull type of lever can be used. By pushing on one end of the lever, the other end of the lever pulls the inner base upward with respect to the outer base. To those of ordinary skill in the art, other methods of raising the inner base will be apparent including various types of levers, motors, and mechanisms.

The present invention extracts semiconductor packages from semiconductor package holders on a circuit board efficiently and without causing damage. Although great amounts of force are required to remove a semiconductor package from a holder, the invention alleviates this impediment by securely gripping the edges of the package, simplifying the application of force by simply turning a bolt, and evenly distributing the lifting force to the edges of the outer base. The invention securely grips the semiconductor package, preventing the chipping or cracking of the package edges or the bending of pins. The circuit board is not scratched and surrounding parts and chips on the circuit board are not damaged.

Although the present invention has been fully described above with reference to specific embodiments, other alternative embodiments will be apparent to those of ordinary skill in the art. Therefore, the above description should not be taken as limiting the scope of the present invention which is defined by the appended claims.

What is claimed is:

1. An apparatus for extracting a semiconductor package from a circuit board, comprising:
    (a) an outer base with a plurality of rigid sides defining an interior region there between;
    (b) an inner base, said inner base including:
        (i) a plurality of levers, each of said levers having an interior edge and an exterior edge;
        (ii) an inner frame to which said plurality of levers are pivotally attached;
        (iii) a swinging means formed on each of the interior edges of said plurality of levers for swinging said plurality of levers outwardly surrounding the semiconductor package on the circuit board; and
        (iv) a cut angle formed on each of the exterior edges of said plurality of levers for contacting a lower edge of said plurality of rigid sides of said outer base as said inner base enters the interior region of said outer base thereby causing said plurality of levers to swing inward grasping the semiconductor package;
    (c) a means for movably coupling said inner base to said outer base, said inner base located in the interior region of said outer base; and
    (d) a means for raising and lowering said inner base and said plurality of levers grasping the semiconductor package with respect to said outer base thereby removing the semiconductor package from the circuit board.

2. The apparatus of claim 1 wherein said means for movably coupling said inner base to said outer base includes a bolt, such that said bolt is inserted into a bolt aperture in the outer base which is not threaded and larger in diameter than the bolt and a bolt aperture in the inner base which is threaded.

3. The apparatus of claim 1 wherein said means for raising and lowering said inner base with respect to said outer base comprises a bolt movably coupling said outer base to said inner base which is turned to raise and lower said inner base with respect to said outer base.

4. The apparatus of claim 1 wherein said swinging means formed on each of the interior edges of said plurality of levers for swinging said plurality of levers outwardly includes a cut angle on the lower interior edges of said plurality of levers such that when said plurality of levers are lowered, said plurality of levers are caused to swing outward upon contact of said cut angle with the semiconductor package.

5. The apparatus of claim 1 wherein the grasping of the semiconductor package includes a cut angle formed on each of the interior edges of the levers for securely grasping the edges of the semiconductor package as said inner base is raised upward thereby removing the semiconductor package from the circuit board.

6. A method of extracting a semiconductor package from a circuit board comprising:
    providing a tool having an inner base surrounded by an outer base, said inner base having a plurality of levers, each of said levers having an interior lower edge and an exterior edge, each of said interior lower edge and exterior edge having a cut angle formed thereon;
    (c) lifting said tool relative to the circuit board, causing the plurality of levers grasping the semiconductor package, thereby removing the semiconductor package from the circuit board.

7. The method of claim 6 wherein said step of grasping the edges of the semiconductor package includes contacting a cut angle formed on each of the interior edges of the plurality of levers with the edges of the semiconductor package.

8. The method of claim 6 wherein said step of lifting the semiconductor package includes turning a bolt provide with said tool to raise the levers relative to the circuit board.

* * * * *